(12) United States Patent
Keehr

(10) Patent No.: US 7,456,766 B2
(45) Date of Patent: Nov. 25, 2008

(54) SIGMA-DELTA MODULATION WITH OFFSET

(75) Inventor: Edward Arthur Keehr, Pasadena, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/489,960

(22) Filed: Jul. 19, 2006

(65) Prior Publication Data
US 2007/0139239 A1   Jun. 21, 2007

(51) Int. Cl.
*H03M 1/20* (2006.01)
(52) U.S. Cl. .................................. 341/131; 341/143
(58) Field of Classification Search .................. 341/64, 341/143, 131, 155; 375/247, 285, 254, 243
See application file for complete search history.

(56) References Cited

U.S. PATENT DOCUMENTS

| | | | | |
|---|---|---|---|---|
| 4,209,773 A | * | 6/1980 | Everard | 341/64 |
| 4,937,576 A | * | 6/1990 | Yoshio et al. | 341/131 |
| 5,363,101 A | * | 11/1994 | Ueki | 341/143 |
| 6,114,981 A | | 9/2000 | Nagata | |
| 6,442,213 B1 | * | 8/2002 | Krone et al. | 375/285 |
| 6,834,335 B2 | * | 12/2004 | Fallah et al. | 711/220 |
| 7,164,375 B2 | * | 1/2007 | Sawada | 341/143 |
| 7,194,036 B1 | * | 3/2007 | Melanson | 375/247 |

FOREIGN PATENT DOCUMENTS

JP            01/198830 A1    8/1989

OTHER PUBLICATIONS

Radke et al, "A 14-Bit Current-Mode ΣΔ DAC Based Upon Rotated Data Weighted Averaging", IEEE Journal of Solid-State Circuits, vol. 35, No. 8, pp. 1074-1084, Aug. 2000.

* cited by examiner

*Primary Examiner*—Peguy JeanPierre
(74) *Attorney, Agent, or Firm*—Howard H. Seo; William Marcus Hooks; Thomas R. Rouse

(57) ABSTRACT

Techniques for performing ΣΔ modulation with offset in order to reduce out-of-band quantization noise are described. In an exemplary oversampling DAC that implements ΣΔ modulation with offset, an interpolation filter performs upsampling and interpolation filtering on data samples to generate input samples. A summer adds an offset to the input samples to generate intermediate samples. The offset alters the characteristics of the quantization noise from a ΣΔ modulator and may be selected to obtain the desired quantization noise characteristics, to retain as much dynamic range as possible, and to simplify the removal of the offset. The ΣΔ modulator performs upsampling and noise shaping on the intermediate samples and provides output samples. An offset removal unit removes at least a portion of the offset from the output samples in the digital or analog domain. A DAC converts the output samples to analog.

21 Claims, 7 Drawing Sheets

US 7,456,766 B2

SIGMA-DELTA MODULATION WITH OFFSET

BACKGROUND

I. Field

The present disclosure relates generally to electronics, and more specifically to sigma-delta (ΣΔ) modulation.

II. Background

ΣΔ modulators are widely used for various applications such as oversampling audio digital-to-analog converters (DACs), oversampling analog-to-digital converters (ADCs), instrumentation DACs, and so on. A ΣΔ modulator receives a digital input with many bits (e.g., 16 bits) of resolution at a low input sample rate and generates a digital output having the same resolution but using one or few bits at a high output sample rate. The ΣΔ modulator can generate the digital output using a quantizer having one or few bits of resolution and can thus achieve good linearity. Furthermore, the ΣΔ modulator can spectrally shape quantization noise such that most of the noise is pushed away from the desired signal band toward higher frequencies. The out-of-band noise at higher frequencies can be more easily filtered with a simple analog filter.

However, the high frequency out-of-band noise from the ΣΔ modulator may cause certain problems even in the presence of analog filtering. For example, the out-of-band noise may mix with other signals prior to filtering and fold back into the desired signal band, thus raising the in-band noise floor. The higher noise floor may cause the ΣΔ modulator to fail signal-to-noise ratio (SNR) and/or other specifications. Furthermore, the out-of-band noise may be processed by digital circuitry located on an analog integrated circuit (IC) die. The quantization noise directly translates into the activity rate of the digital circuitry during sensitive periods of operation and may corrupt analog circuit blocks located nearby, thus raising the noise floor of these analog circuit blocks. These deleterious effects due to out-of-band noise from the ΣΔ modulator are undesirable and may even be detrimental.

There is therefore a need in the art for techniques to reduce out-of-band noise from a ΣΔ modulator.

SUMMARY

Techniques for performing ΣΔ modulation with an offset in order to reduce out-of-band quantization noise are described herein. In an embodiment of an oversampling DAC that implements ΣΔ modulation with offset, an interpolation filter performs upsampling and interpolation filtering on data samples and generates input samples. A summer adds an offset to the input samples to generate intermediate samples. The offset alters the characteristics of the quantization noise from a ΣΔ modulator and may be selected to obtain the desired quantization noise characteristics, to retain as much dynamic range as possible, and to simplify the removal of the offset, as described below. The ΣΔ modulator performs upsampling and noise shaping on the intermediate samples and provides output samples. An offset removal unit removes at least a portion of the offset from the output samples in the digital domain (e.g., by inverting all of the bits of each output sample) and/or in the analog domain (e.g., by adding an offset in an analog circuit). A DAC converts the output samples to analog using multiple DAC elements. A dynamic element matching (DEM) unit selects different ones of the DAC elements based on the output samples. A lowpass filter filters the analog signal from the DAC to remove out-of-band noise. An amplifier amplifies and/or buffers the filtered signal to generate an output signal.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
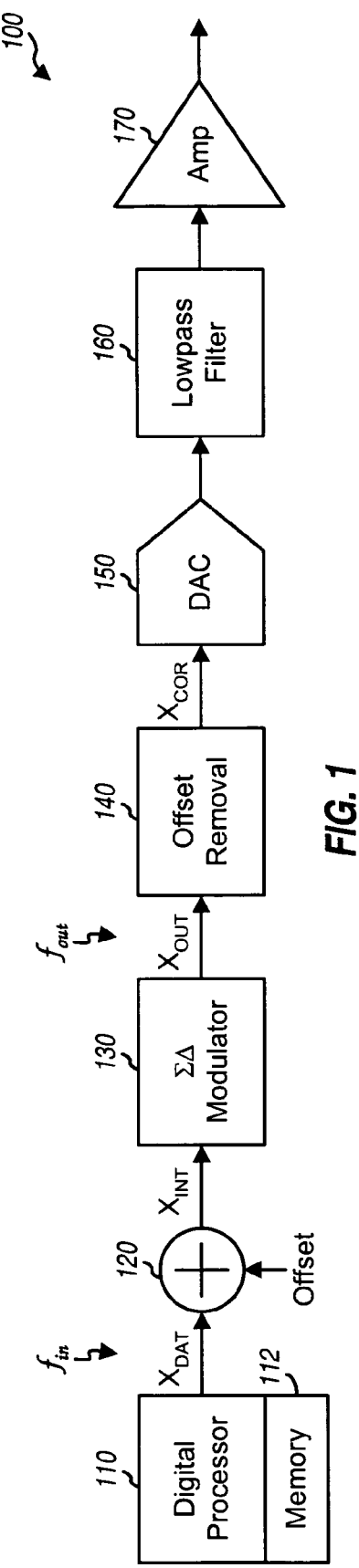
FIG. 1 shows an oversampling DAC implementing ΣΔ modulation with offset.

FIG. 1 shows a block diagram of an embodiment of an oversampling DAC 100 that implements ΣΔ modulation with offset. DAC 100 may be used for an oversampling audio DAC and other applications.

For the embodiment shown in FIG. 1, a digital processor 110 generates data samples $X_{DAT}$ with a desired number of (N) bits at a sample rate of $f_{in}$. A memory 112 stores data and program codes for processor 110. A summer 120 adds an offset to each data sample from processor 110 and provides intermediate samples $X_{INT}$. The offset is a static value that may be selected as described below. A register (not shown in FIG. 1 but may be part of a ΣΔ modulator 130) performs a combined upsampling and zero-order hold interpolation operation on the intermediate samples. ΣΔ modulator 130 performs noise shaping on the upsampled samples and provides output samples $X_{OUT}$ with one or few (M) bits at a sample rate of $f_{out}$. The output sample rate is typically many times higher than the input sample rate. For example, N may be equal to 16, M may be equal to 1, 2 or 4, and the oversampling ratio (OSR) may be equal to 32 or 256. In particular, $OSR = f_s / 2f_{BW}$ where $f_{BW}$ is the bandwidth of the signal being processed and $f_s$ is the sampling rate. Since the OSR is 1 for digital processor 110, an increase in sampling rate by a factor K results in a corresponding increase of K in OSR. Other values are also possible for N, M, and OSR. An exemplary design for ΣΔ modulator 130 is described below. ΣΔ modulator 130 has a particular noise transfer function that is determined by the design of the ΣΔ modulator. The offset added to the data samples via summer 120 results in the quantization noise being attenuated at high frequencies, as described below.

An offset removal unit 140 removes all or a portion of the offset in the output samples and provides corrected samples $X_{COR}$. The offset removal may be performed in the digital domain (as shown in FIG. 1) or in the analog domain (not shown in FIG. 1). An M-bit DAC 150 converts the corrected digital samples to analog and provides an analog signal. A lowpass filter 160 filters the analog signal to remove out-of-band noise and provides a filtered signal. Lowpass filter 160 may also be called a post filter, a reconstruction filter, and so on. An amplifier (Amp) 170 amplifies and/or buffers the filtered signal and provides an output signal, e.g., to a speaker or some other output circuit.

Figure 2:
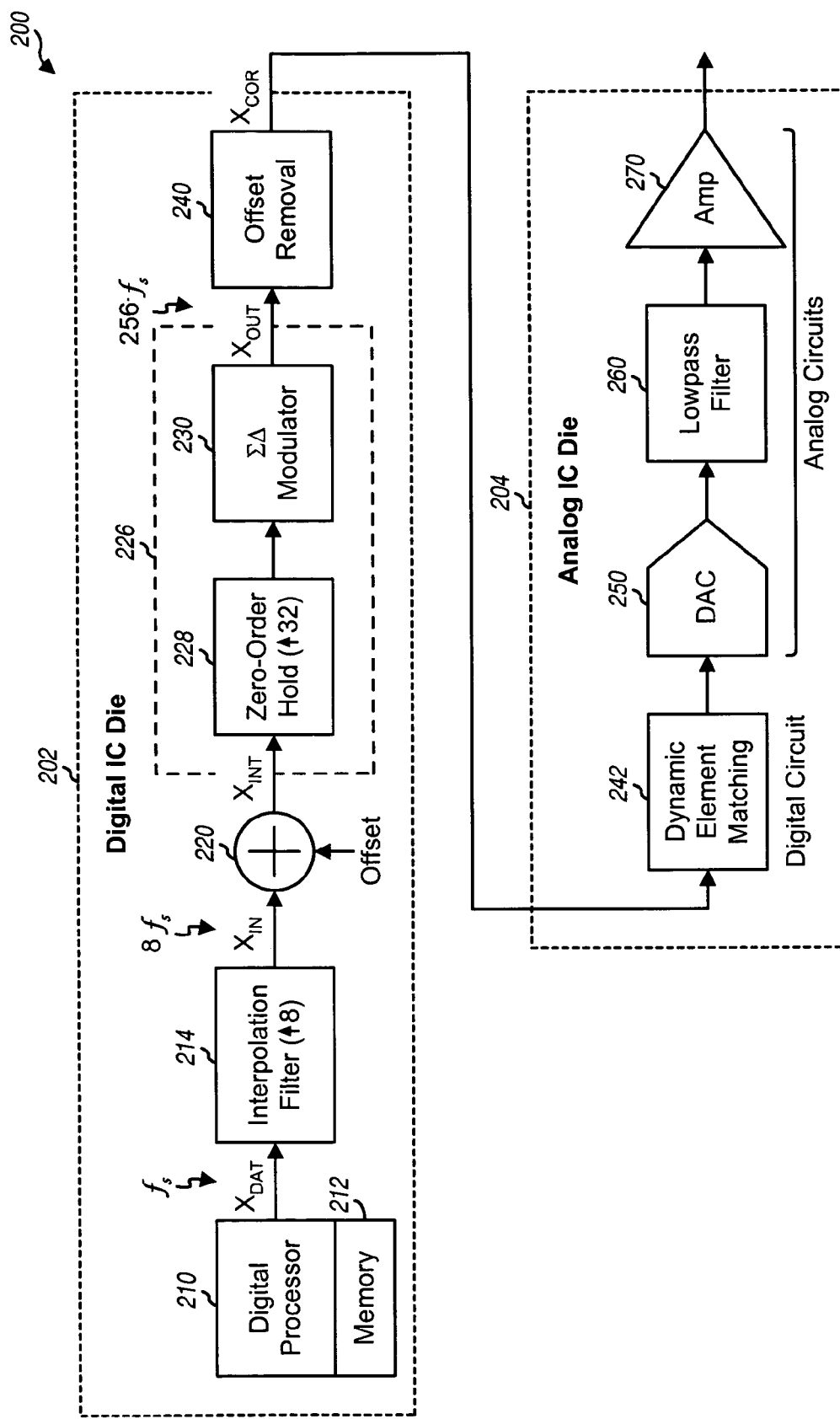
FIG. 2 shows another oversampling DAC implementing ΣΔ modulation with offset.

FIG. 2 shows a block diagram of another embodiment of an oversampling DAC 200 that implements ΣΔ modulation with offset. DAC 200 may also be used for an oversampling audio DAC and other applications.

For the embodiment shown in FIG. 2, a digital processor 210 generates data samples $X_{DAT}$ with N bits of resolution at a sample rate of $f_s$. A memory 212 stores data and program codes for processor 110. An interpolation filter 214 upsamples the data samples by a factor of 8, performs interpolation filtering, and provides input samples $X_{IN}$ with N bits of resolution at a sample rate of $8f_s$. A summer 220 adds an offset to each input sample from filter 214 and provides intermediate samples $X_{INT}$.

A unit 226 performs upsampling and noise shaping. Within unit 226, a zero-order hold (ZOH) unit 228 performs upsampling by a factor of 32 by holding each intermediate sample for 32 cycles of the clock used for a ΣΔ modulator 230. ΣΔ modulator 230 quantizes the samples from ZOH unit 228 to M bits, performs noise shaping, and provides output samples $X_{OUT}$ with M bits at a sample rate of $256f_s$. An offset removal unit 240 removes all or a portion of the offset in the output samples and provides corrected samples $X_{COR}$. A dynamic element matching (DEM) unit 242 receives the corrected samples and dynamically selects different elements within a DAC 250 to ameliorate the deleterious effects of mismatches in these DAC elements. DAC 250 converts the corrected samples to analog and provides an analog signal. A lowpass filter 260 filters the analog signal to remove out-of-band noise and provides a filtered signal. An amplifier 270 amplifies and/or buffers the filtered signal and provides an output signal.

FIG. 2 also shows an embodiment for implementing oversampling DAC 200. For this embodiment, digital processor 210 through offset removal unit 240 are implemented on a digital IC die 202, and DEM unit 242 through amplifier 270 are implemented on an analog IC die 204. For this embodiment, DEM unit 242 is implemented on the analog IC die, even though it is a digital circuit, in order to reduce the number of signal lines that pass between digital IC die 202 and analog IC die 204. An M-bit ΣΔ modulator can interface with DEM unit 242 via only M signal lines. DEM unit 242 performs thermometer code translation, which alters the data such that it contains $2^M$ levels. These $2^M$ levels interface directly with the analog hardware.

DEM unit 242 may introduce a relatively large amount of digital noise into the substrate and/or the power supplies of the analog IC die. This digital noise may degrade the performance of nearby analog circuits. This digital noise may be dependent on the characteristics of the quantization noise from the ΣΔ modulator. By altering the quantization noise characteristics with the added offset, the digital noise from DEM unit 242 may be mitigated, and performance may be improved for the nearby analog circuits.

ΣΔ modulator 130 in FIG. 1 and ΣΔ modulator 230 in FIG. 2 may be implemented with various designs. Furthermore, ΣΔ modulators 130 and 230 may receive samples with any number of bits and may provide output samples with any number of bits. An exemplary ΣΔ modulator design is described below.

Figure 3:
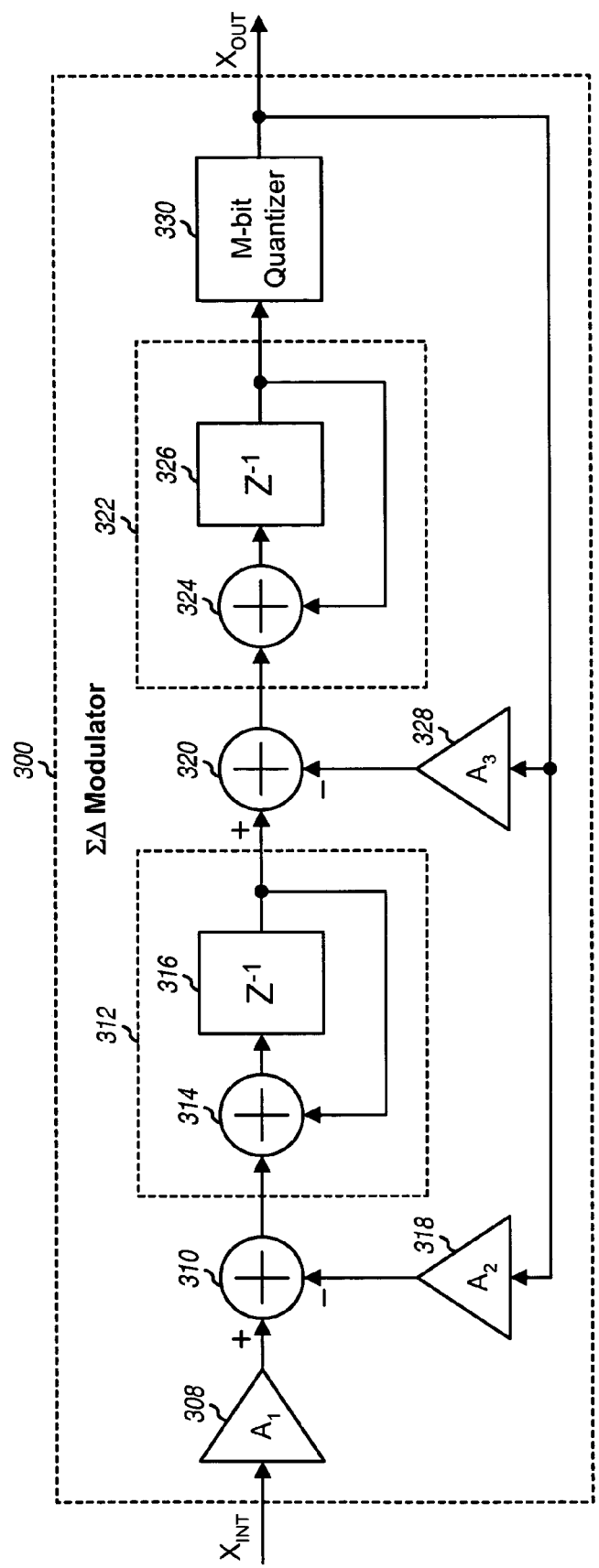
FIG. 3 shows a block diagram of a second-order 4-bit ΣΔ modulator.

FIG. 3 shows a block diagram of an embodiment of a second-order M-bit ΣΔ modulator 300, which may be used for each of ΣΔ modulators 130 and 230 in FIGS. 1 and 2, respectively. For the embodiment shown in FIG. 3, ΣΔ modulator 300 includes an input gain element 308, two stages of noise shaping, and an M-bit quantizer 330. Gain element 308 receives and scales the intermediate samples $X_{INT}$ with a gain of $A_1$. The intermediate samples have N bits of resolution, where N may be 16 or some other value.

For the first noise shaping stage, a summer 310 subtracts the output of a gain element 318 from the output of gain element 308 and provides the difference to a filter section 312. Filter section 312 includes a summer 314 and a delay element 316. Summer 314 sums the output of summer 310 with the output of delay element 316. Delay element 316 receives the output of summer 314 and provides a delay of one clock period. For the second noise shaping stage, a summer 320 subtracts the output of a gain element 328 from the output of delay element 316 and provides the difference to a filter section 322. Within filter section 322, a summer 324 sums the output of summer 320 with the output of a delay element 326. Delay element 326 receives the output of summer 324 and provides a delay of one clock period.

The elements within ΣΔ modulator 300 may be designed with more than N bits of resolution. Quantizer 330 quantizes the output of delay element 326 and provides M-bit output samples $X_{OUT}$. Quantizer 330 has a gain of $A_Q$, which may be 1 for a multi-bit quantizer but may be ill-defined for a 1-bit modulator. Gain element 318 scales the output samples with a gain of $A_2$, and gain element 328 scales the output samples with a gain of $A_3$.

The transfer function G(z) for each of filter sections 312 and 322 may be expressed as:

$$G(z) = \frac{z^{-1}}{1-z^{-1}}, \qquad \text{Eq (1)}$$

where $z^{-1}$ denotes a delay of one clock cycle by each of delay elements 316 and 326.

For ΣΔ modulator 300, the overall transfer function H(z) for the desired signal may be expressed as:

$$H(z) = \frac{\frac{A_1 \cdot A_Q}{2^{N-M}} \cdot z^{-2}}{1 + (A_3 \cdot A_Q - 2) \cdot z^{-1} + (1 + A_2 \cdot A_Q - A_3 \cdot A_Q) \cdot z^{-2}}. \qquad \text{Eq (2)}$$

On a z-plane, the signal transfer function H(z) has two zeros at 0+j0 and two complex poles at a±jb, where a and b are determined by the gains $A_2$, $A_3$ and $A_Q$. The signal transfer function H(z) has a lowpass shape.

For ΣΔ modulator 300, the overall transfer function N(z) for the quantization noise may be expressed as:

$$N(z) = \frac{A_Q \cdot (1-z^{-1})^2}{1 + (A_3 \cdot A_Q - 2) \cdot z^{-1} + (1 + A_2 \cdot A_Q - A_3 \cdot A_Q) \cdot z^{-2}}. \qquad \text{Eq (3)}$$

On a z-plane, the noise transfer function N(z) has two zeros at 1+j0 and two complex poles at a±jb. The noise transfer function N(z) has a highpass shape.

FIG. 3 shows an exemplary design of a ΣΔ modulator. The techniques described herein may be used with various ΣΔ modulators having any number of output bits, any order, any number of sections and stages, and so on. For clarity, some parts of the description below are for ΣΔ modulator 300 in FIG. 3.

A ΣΔ modulator may implement any one of various quantization schemes known in the art. In a first scheme, a range of "0" to "4095" in the 16-bit domain maps to a "0" in the 4-bit domain, and a range of "–1" to "–4096" in the 16-bit domain maps to a "–1" in the 4-bit domain. This scheme allows for simple quantization in the digital domain, e.g. by dropping bits. In a second scheme, a range of "2047" to "–2048" in the 16-bit domain maps to "0" in the 4-bit domain. Different quantization schemes may have different noise characteristics. The output of second filter section 322 may hover around "0" for a small input signal, which is the case where quantization noise really matters. In the first scheme, the quantizer output may transition to "–1" on a regular basis because the threshold –1 is so close. In the second scheme, the quantizer output may trip to "–1" and "1" much less frequently because the thresholds 2047 and –2048 are farther away, and hence its activity rate will be lower. The techniques described herein may be used for all quantization schemes and are especially beneficial for the first scheme.

Adding an offset to the input samples affects the characteristics of the quantization noise from the ΣΔ modulator. In particular, out-of-band noise at high frequencies may be reduced by applying an appropriate offset. This reduction in out-of-band noise is illustrated blow.

Figure 4A:
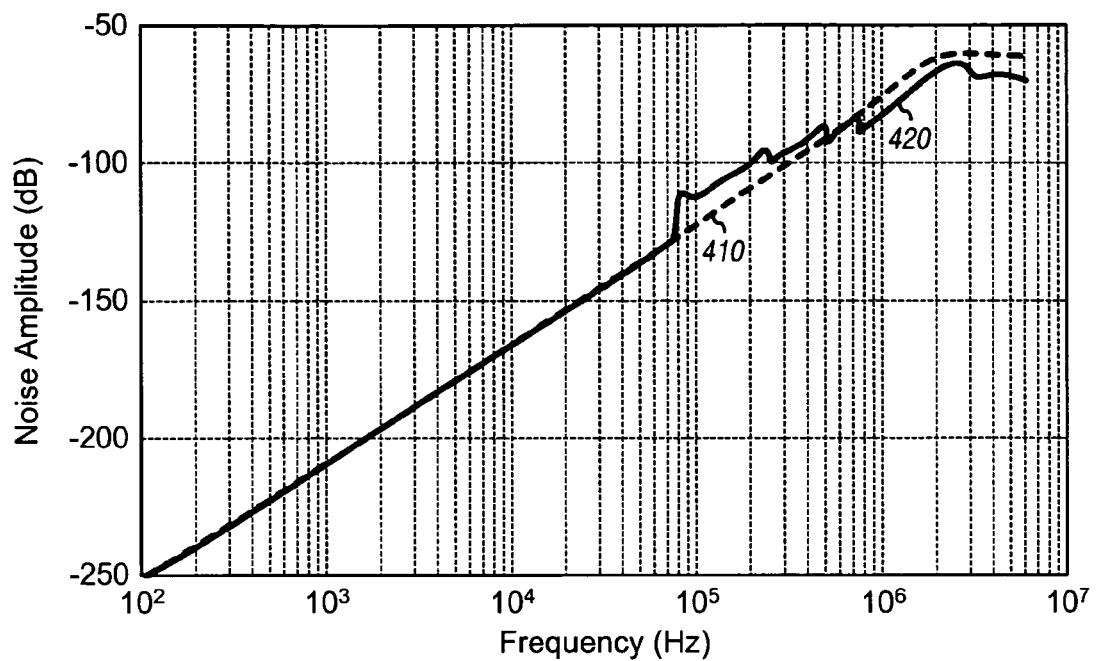
FIGS. 4A and 4B show quantization noise without and with offset.

FIG. 4A shows a plot 410 of the quantization noise from ΣΔ modulator 300 in FIG. 3 without any offset (which is referred to as the original scheme) and a plot 420 of the quantization noise from the same ΣΔ modulator with an offset of –4929 applied to 16-bit input samples (which is referred to as the offset scheme). For this example, N=16, M=4, the input sample rate is $f_s$=48 KHz, and the output sample rate is $256f_s$=12.288 MHz. The quantization noise is plotted on a graph with a logarithmic x-axis for frequency. FIG. 4A shows the quantization noise characteristic for a small input signal, which is an important case because signal-to-noise ratio is required to be high for a small input signal. The quantization noise characteristics may be different for a large input signal.

Without any offset, the noise amplitude increases at a rate of 40 decibels (dB) per decade of frequency, as expected for a second-order ΣΔ modulator. The noise amplitude flattens out at approximately 2 MHz, as indicated by plot 410. With an offset of –4929, the noise amplitude increases at a rate of 40 dB per decade of frequency but dips lower at higher frequencies. As shown in FIG. 4A and also in FIG. 4B below, for both schemes, the bulk of the quantization noise from the ΣΔ modulator appears at higher frequencies from approximately 1 MHz to just over 6 MHz, the latter of the two frequencies denoting half of the output sample rate. However, the noise amplitude with the offset is lower than the noise amplitude without any offset at higher frequencies, as indicated by plots 410 and 420.

Figure 4B:
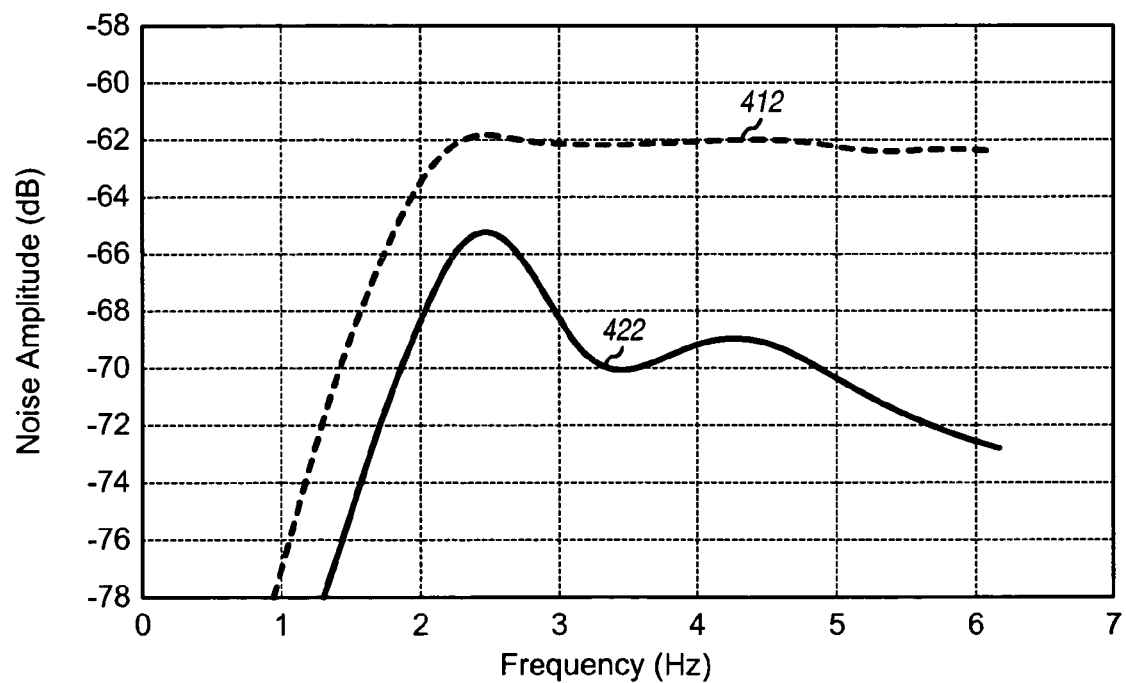

FIG. 4B shows more detailed plots of the quantization noise at higher frequencies. The quantization noise from ΣΔ modulator 300 without any offset is shown by a plot 412, and the quantization noise from the same ΣΔ modulator with an offset of –4929 is shown by a plot 422. Plots 412 and 422 indicate that the out-of-band noise is reduced by up to 10 dB at higher frequencies by adding the offset. This amount of noise reduction translates to the offset scheme having a signal variance that is over nine times less than the signal variance for the original scheme.

FIGS. 4A and 4B show the reduction in out-of-band noise for a specific 4-bit ΣΔ modulator with a specific offset of –4929 applied to 16-bit input samples. This particular offset provides several advantages. First, an offset of –4929 applied to the 16-bit input samples results in an offset of approximately –1 in the 4-bit output samples from the ΣΔ modulator. Since the output offset is close to one least significant bit (LSB) of the 4-bit output, most of this offset can be easily removed digitally, as described below. Second, a 16-bit offset of –4929 avoids clipping of the input signal by the ΣΔ modulator. The ΣΔ modulator has a 4-bit range of +7 to –8. With no offset, the output of the ΣΔ modulator is within a range of +7 to –7. With an offset of –4929, the output of the ΣΔ modulator is within a range of +6 to –8, which is valid. However, if an offset of +4929 is used, then the output of the ΣΔ modulator is within a range of +8 to –6, which is not valid since +8 is not available. Hence, for a very large signal, the ΣΔ modulator will clip with an offset of +4929, and the input signal will have a reduced dynamic range from the top end.

FIGS. 4A and 4B show the quantization noise for an exemplary ΣΔ modulator design without and with a specific offset applied to the input samples. In general, an offset may produce signal statistics that allow the feedback within a ΣΔ modulator to more rapidly attenuate the magnitude of the internal states, thus decreasing the variance of the output signal. Different noise characteristics may be obtained with different ΣΔ modulators and/or different offsets. For a given ΣΔ modulator, various offsets may be used to lower the out-of-band quantization noise. The desired noise characteristics may be obtained by selecting a suitable offset for the ΣΔ modulator. This suitable offset may be determined based on computer simulation, empirical measurement, lab testing, and so on.

It may be desirable to remove the offset introduced via summer 220. First, the offset may lower the effective dynamic range of the system because the signal is no longer centered between two power supply rails. Hence, the margin before hitting one of the rails is reduced. Second, an output signal may be direct current (DC) coupled, e.g., from a power amplifier to a speaker in an audio system. Any DC offset introduced in the digital domain and not removed will cause a DC offset from the nominal center voltage at the power amplifier output. If the DC offset is substantial, then significant DC power may flow through the speaker coil and possibly damage the speaker, in addition to consuming more standby power.

In an embodiment, the offset added prior to the ΣΔ modulator is removed digitally after the ΣΔ modulator, e.g., by offset removal unit 140 in FIG. 1 or unit 240 in FIG. 2. The offset may be removed by subtracting the offset from the output samples generated by the ΣΔ modulator. If the output samples are represented in twos complement format and if the offset is approximately –1 in the output samples, then the offset may be removed by simply inverting each of the M bits in the output samples. Table 1 shows the output of a 4-bit ΣΔ modulator in binary and decimal formats and the inverted output in binary and decimal formats.

TABLE 1

| ΣΔ Modulator Output (binary) | ΣΔ Modulator Output (decimal) | Inverted ΣΔ Modulator Output (binary) | Inverted ΣΔ Modulator Output (decimal) |
|---|---|---|---|
| 0111 | +7 | 1000 | –8 |
| 0110 | +6 | 1001 | –7 |
| 0101 | +5 | 1010 | –6 |
| 0100 | +4 | 1011 | –5 |
| 0011 | +3 | 1100 | –4 |
| 0010 | +2 | 1101 | –3 |
| 0001 | +1 | 1110 | –2 |

TABLE 1-continued

| ΣΔ Modulator Output (binary) | ΣΔ Modulator Output (decimal) | Inverted ΣΔ Modulator Output (binary) | Inverted ΣΔ Modulator Output (decimal) |
|---|---|---|---|
| 0000 | 0 | 1111 | −1 |
| 1111 | −1 | 0000 | 0 |
| 1110 | −2 | 0001 | +1 |
| 1101 | −3 | 0010 | +2 |
| 1100 | −4 | 0011 | +3 |
| 1011 | −5 | 0100 | +4 |
| 1010 | −6 | 0101 | +5 |
| 1001 | −7 | 0110 | +6 |
| 1000 | −8 | 0111 | +7 |

From Table 1, the output of the ΣΔ modulator, $X_{OUT}$, and the inverted output, $X_{COR}$, may be expressed as:

$$X_{COR} = -(1 + X_{OUT}). \quad \text{Eq (4)}$$

As shown in Table 1 and equation (4), inverting each of the four bits in the output samples from the 4-bit ΣΔ modulator has the effect of (1) adding an offset of +1 to the output samples and (2) inverting the resultant samples. The corrected samples $X_{COR}$, after the bit inversion, are inverted with respect to both the data samples $X_{DAT}$ from digital processor 210 and the input samples $X_{IN}$ from interpolation filter 214 in FIG. 2. For audio application, signal inversion does not affect the output sound, and there is no need to correct the signal inversion. Even if there was a need to invert the signal there are typically differential paths within the analog circuitry that may be swapped to invert the signal with no circuitry overhead. For an application in which signal polarity is important, either the data samples $X_{DAT}$ or the input samples $X_{IN}$ may be inverted to account for the signal inversion resulting from the bit inversion.

In another embodiment, the offset added prior to the ΣΔ modulator is removed in the analog domain after the ΣΔ modulator, e.g., with DAC 250 in FIG. 2. A specific embodiment for removing the offset in the analog domain is described below.

Figure 5:
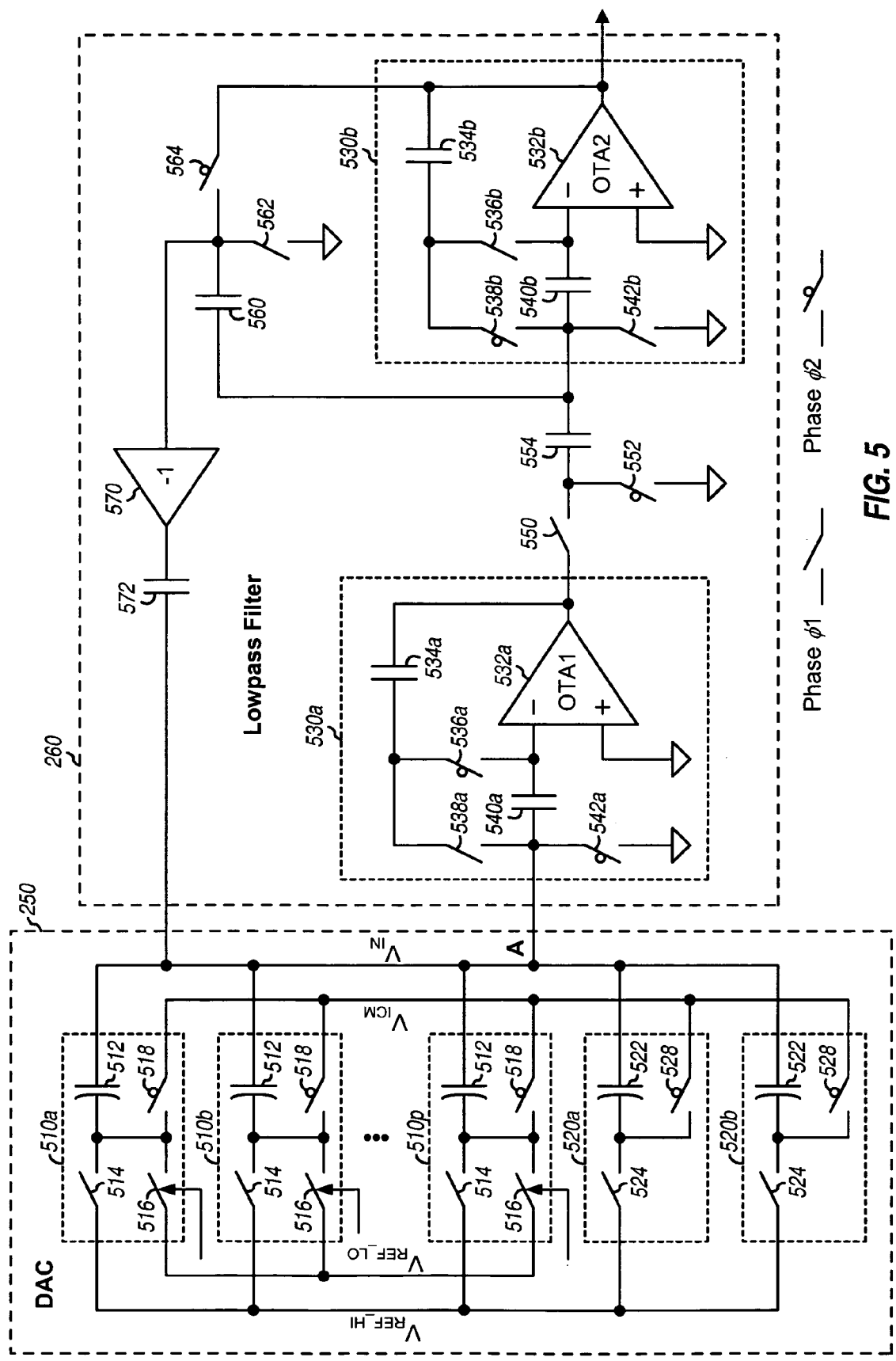
FIG. 5 shows a block diagram of a DAC and a lowpass filter.

FIG. 5 shows a schematic diagram of an embodiment of DAC 250 in FIG. 2. For this embodiment, DAC 250 is implemented as a 4-bit switch-capacitor DAC. DAC 250 includes 16 DAC elements 510a through 510p for 16 possible levels with four bits. Each DAC element 510 includes a capacitor 512 and switches 514, 516, and 518. Capacitor 512 has one end coupled to node A and the other end coupled to one end of switches 514, 516, and 518. The other end of switch 514 couples to a high reference voltage $V_{REF\_HI}$. The other end of switch 516 couples to a low reference voltage $V_{REF\_LO}$. The other end of switch 518 couples to a mid or input common mode voltage $V_{ICM}$.

The 16 DAC elements 510a through 510p receive 16 control signals from DEM unit 242, one control signal for each DAC element. Each control signal controls switches 514 and 516 in an associated DAC element 510. During clock phase ϕ1, control signal i for DAC element 510i, where i=a, . . . , p, turns on either switch 514 to couple capacitor 512 to $V_{REF\_HI}$ or switch 516 to couple capacitor 512 to $V_{REF\_LO}$. Capacitor 512 is thus coupled to either $V_{REF\_HI}$ or $V_{REF\_LO}$ depending on the logic value for control signal i. During clock phase ϕ2, switches 518 for all 16 DAC elements 510a through 510p are turned on, and capacitors 512 for all DAC elements are coupled to $V_{ICM}$. Clock phases ϕ1 and ϕ2 may correspond to logic high and logic low, respectively, of the clock used for DAC 250.

If no offset is added to the input samples, then the output samples would have no offset. In this case, an average of 8 DAC elements would be coupled to $V_{REF\_HI}$, and an average of 8 DAC elements would be coupled to $V_{REF\_LO}$. If $V_{REF\_HI} = -V_{REF\_LO}$, then the net average input provided to lowpass filter 260 may be expressed as:

$$8 \cdot C_{unit} \cdot V_{REF\_HI} + 8 \cdot C_{unit} \cdot V_{REF\_LO} = 0 \quad \text{Eq (5)}$$

where $C_{unit}$ is the capacitance of capacitor 512 in each of DAC elements 510a through 510p.

However, if an offset of −4929 is added to the 16-bit input samples, then the 4-bit output samples would have an offset of approximately −1. In this case, an average of 7 DAC elements would be coupled to $V_{REF\_HI}$, and an average of 9 DAC elements would be coupled to $V_{REF\_LO}$. If $V_{REF\_HI} = -V_{REF\_LO}$, then the net average input provided to lowpass filter 260 may be expressed as:

$$7 \cdot C_{unit} \cdot V_{REF\_HI} + 9 \cdot C_{unit} \cdot V_{REF\_LO} = -2 \cdot C_{unit} \cdot V_{REF\_HI}. \quad \text{Eq (6)}$$

Referring to FIG. 5, two DAC elements 520a and 520b may be used to compensate for the offset shown in equation (6). Each DAC element 520 includes a capacitor 522 and switches 524 and 528 that operate in the same manner as capacitor 512 and switches 514 and 518, respectively, within DAC element 510. Capacitors 522 for DAC elements 520a and 520b are always coupled to $V_{REF\_HI}$ and result in a net average input of approximately 0 provided to lowpass filter 260.

If a 16-bit offset of −4929 is added to the 16-bit input samples and a 4-bit offset of −1 (which correspond to a 16-bit offset of 4096) is removed from the 4-bit output samples, assuming that ΣΔ modulator 230 has a gain of 1.0, then a residual 16-bit offset of −833 (which corresponds to a residual 4-bit offset of 0.20) remains in the analog signal from the DAC. The residual offset may be different if ΣΔ modulator 230 has a gain other than 1.0. In any case, this residual offset may be removed in lowpass filter 260 or may be left in the analog signal.

FIG. 5 also shows an embodiment of lowpass filter 260 in FIG. 2. For this embodiment, lowpass filter 260 is implemented with a switch-capacitor bi-quad filter having two quad sections 530a and 530b. Within each quad section 530, a capacitor 534 has one end coupled to the output of an amplifier 532 and the other end coupled to one end of switches 536 and 538. The other end of switch 536 couples to the inverting input of amplifier 532. The other end of switch 538 couples to the input of the quad section. A capacitor 540 couples between the inverting input of amplifier 532 and the input of the quad section. A switch 542 couples between the input of the quad section and circuit ground.

A switch 550 has one end coupled to the output of amplifier 532a and the other end coupled to one end of a switch 552 and one end of a capacitor 554. The other end of switch 552 couples to circuit ground. The other end of capacitor 554 couples to the input of quad section 530b. A capacitor 560 has one end coupled to the input of quad section 530b and the other end coupled to one end of switches 562 and 564 and to the input of an inverting buffer 570. Inverting buffer 570 may be implemented by simply cross-coupling the wires of a differential signal in a differential circuit design. The other end of switch 562 couples to circuit ground, and the other end of switch 564 couples to the output of quad section 530b. A capacitor 572 couples between the input of quad section 530a and the output of inverting buffer 570. Switches 538a, 536b, 542b, 550 and 562 are turned on during clock phase ϕ1. Switches 536a, 538b, 542a, 552 and 564 are turned on during clock phase ϕ2.

FIG. 5 shows an exemplary design for DAC 250 and lowpass filter 260. In general, DAC 250 and lowpass filter 260 may be implemented with various designs. For example, lowpass filter 260 may be implemented with passive filters and/or active filters.

DEM unit 242 selects different DAC elements in DAC 250 in a predetermined or pseudo-random manner in order to mitigate the deleterious effects of component mismatches in the DAC. For the DAC embodiment shown in FIG. 5, the component mismatches may be due to different capacitances for capacitors 512 in DAC elements 510*a* through 510*p*. By selecting different DAC elements, errors due to mismatches in the DAC elements may be shaped and pushed out of band, without needing to know a priori how the components are mismatched.

Figure 6:
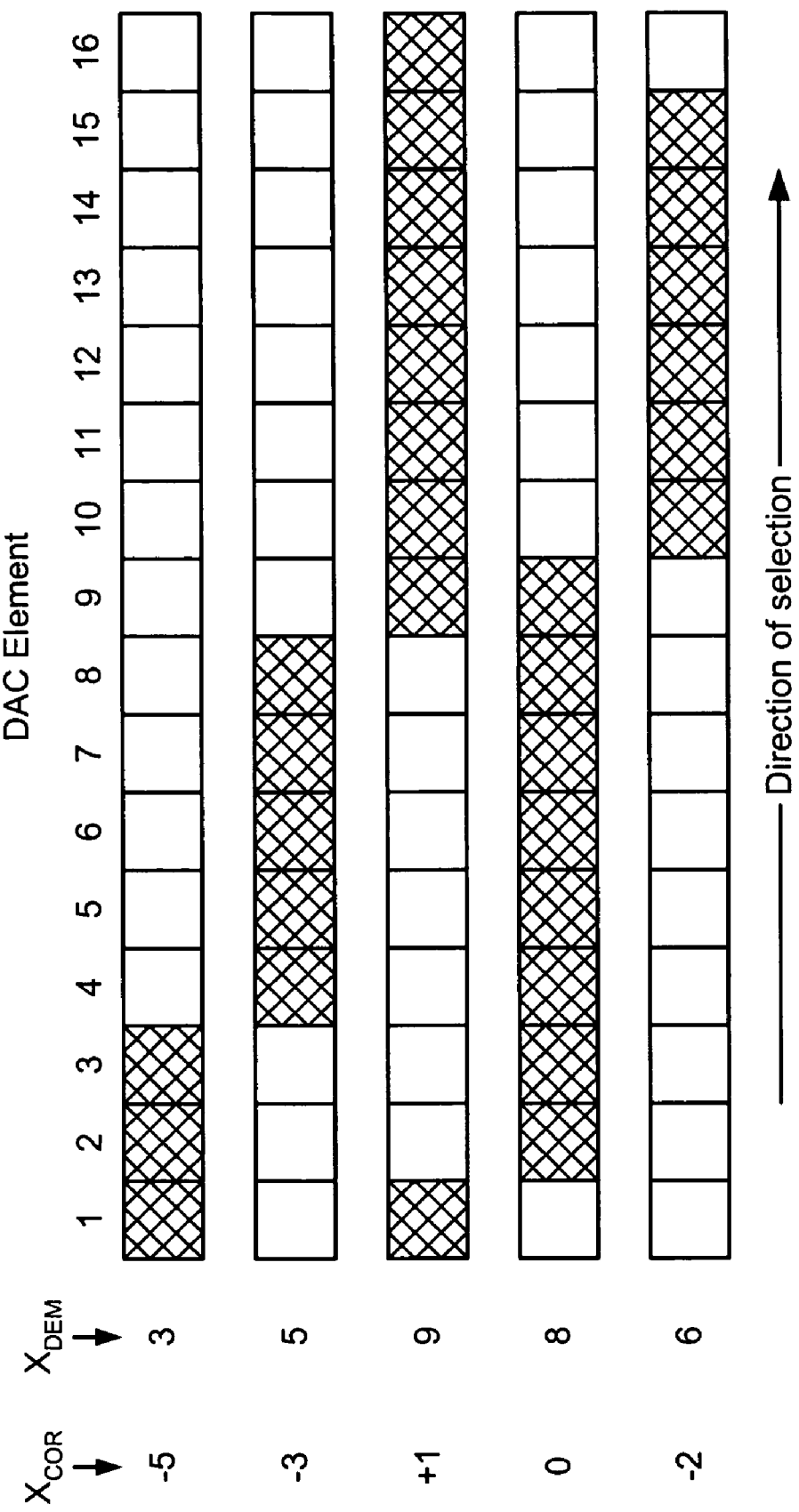
FIG. 6 shows the operation of a DEM unit.

FIG. 6 shows an embodiment of DEM unit 242 in FIG. 2. For this embodiment, DEM unit 242 implements a data weighted averaging (DWA) scheme. The corrected samples $X_{COR}$ from offset removal unit 240 are converted from a zero-mean representation to a representation with a mean of 8. The converted samples $X_{DEM}$ have a range of 1 through 16. Each converted sample enables the number of DAC elements indicated by the value of that converted sample. The DAC elements are selected in a circular manner, starting with the DAC element next to the one last selected. For the example shown in FIG. 6, DEM unit 242 receives a corrected sample sequence of −5, −3, +1, 0, −2, . . . , and generates a converted sample sequence of 3, 5, 9, 8, 6, . . . . DEM unit 242 selects DAC elements 1 through 3 for the first converted sample of 3, then DAC elements 4 through 8 for the second converted sample of 5, then DAC elements 9 through 16 and DAC element 1 for the third converted sample of 9, then DAC elements 2 through 9 for the fourth converted sample of 8, then DAC elements 10 through 15 for the fifth converted sample of 6, and so on.

FIG. 6 shows a specific embodiment of DEM unit 242. DEM unit 242 may also implement other dynamic element matching algorithms known in the art.

Figure 7:
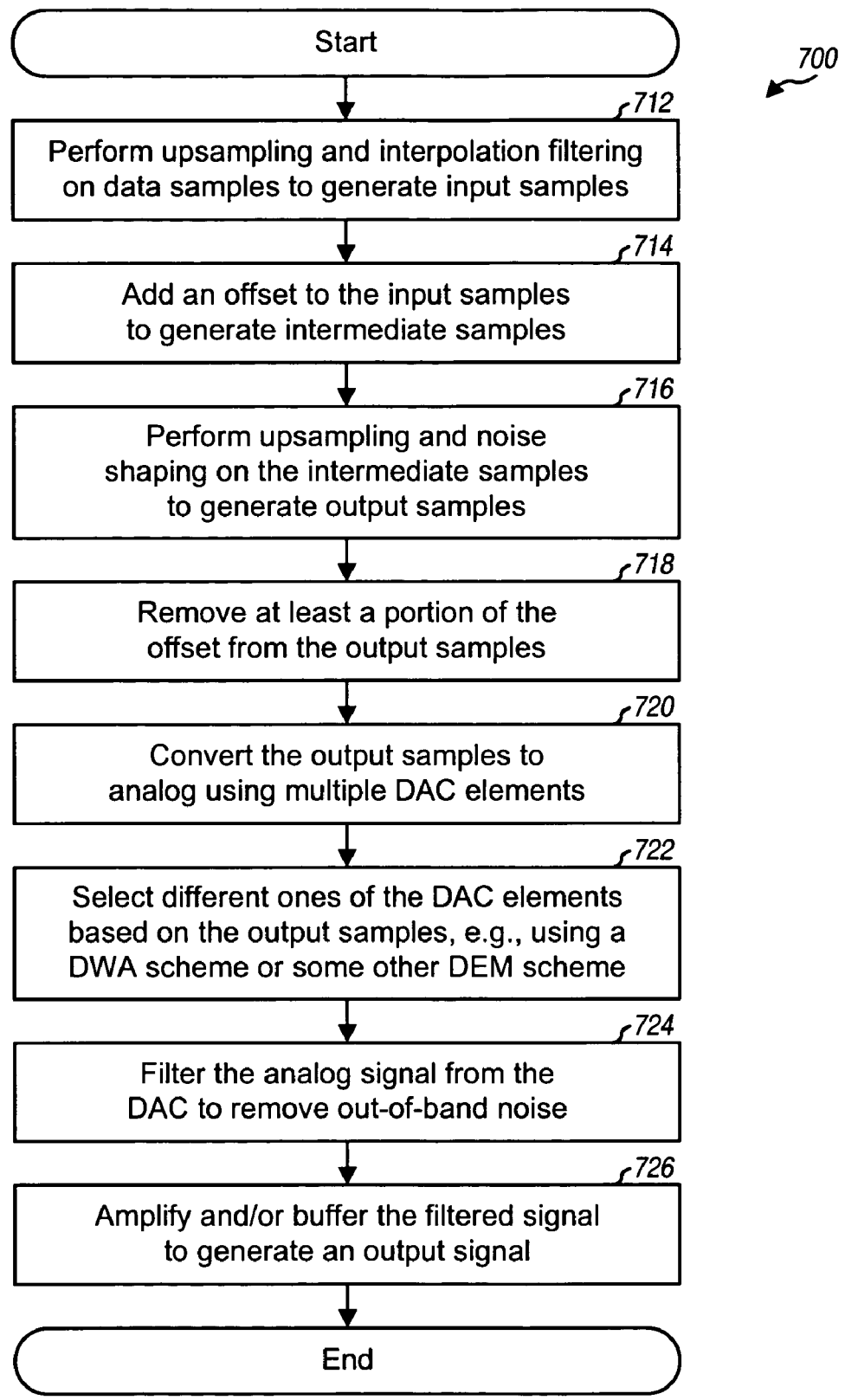
FIG. 7 shows a process for performing oversampling and noise shaping.

FIG. 7 shows an embodiment of a process 700 for performing oversampling and noise shaping. Upsampling and interpolation filtering are performed on data samples to generate input samples (block 712). An offset is added to the input samples to generate intermediate samples (block 714). Upsampling and noise shaping are performed on the intermediate samples to generate output samples (block 716). At least a portion of the offset is removed from the output samples (block 718). The offset may be removed in the digital domain (e.g., by inverting all of the bits of each output sample) or in the analog domain (e.g., by adding an offset in the DAC). Offset removal in the digital domain is often preferred since it typically does not add noise or loss or result in other deleterious effects.

The output samples are converted to analog using multiple DAC elements (block 720). Different DAC elements are selected based on the output samples, e.g., using a DWA scheme or some other DEM scheme (block 722). The analog signal from the DAC is filtered to remove out-of-band noise (block 724). The filtered signal may be amplified and/or buffered to generate an output signal (block 726).

The $\Sigma\Delta$ modulation with offset techniques and the oversampling DACs described herein may be used for various electronics devices such as wireless communication devices (e.g., cellular phones, terminals, and so on), consumer electronics devices (e.g., stereo players, televisions, CD players, and so on), computers, and other devices.

An oversampling DAC may be implemented on one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and/or other electronic units. An oversampling DAC may be implemented on one or multiple IC dies and on one or multiple ICs. For example, all circuitry shown on digital IC die 202 in FIG. 2 may be implemented on one IC die, and all circuitry shown on analog IC die 204 may be implemented on another IC die. As another example, all or most of the circuitry for oversampling DAC 100 or 200 may be implemented on one IC die. The oversampling DAC may also be fabricated with various IC process technologies such as CMOS, NMOS, BJT, and so on.

Certain portions of the oversampling DAC may be implemented in software and/or firmware. For example, the offset may be added with software/firmware. The software/firmware may be stored in a memory (e.g., memory 112 in FIG. 1 or memory 212 in FIG. 2) and executed by a processor (e.g., processor 110 or 210). The memory may be implemented within the processor or external to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
   a summer configured to add an offset to input samples to generate intermediate samples;
   a sigma-delta modulator configured to perform noise shaping on the intermediate samples and provide output samples, wherein each output sample comprises multiple bits; and
   an offset removal unit configured to invert each of the multiple bits of each output sample to remove at least a portion of the offset.

2. The apparatus of claim 1, further comprising:
   an offset removal unit configured to remove at least a portion of the offset from the output samples.

3. The apparatus of claim 1, further comprising:
   an offset removal unit configured to digitally remove at least a portion of the offset from the output samples.

4. The apparatus of claim 1, further comprising:
   an interpolation filter configured to perform upsampling and interpolation filtering on data samples and provide the input samples.

5. The apparatus of claim 1, further comprising:
   a digital-to-analog converter (DAC) comprising a plurality of DAC elements and configured to convert the output samples to analog; and
   a dynamic element matching (DEM) unit configured to select different ones of the plurality of DAC elements based on the output samples.

6. The apparatus of claim 5, wherein the DAC is a switch-capacitor DAC, and wherein the plurality of DAC elements comprise a plurality of switchable capacitors.

7. The apparatus of claim 5, wherein the DEM unit is configured to select the plurality of DAC elements based on a data weighted averaging (DWA) scheme.

8. The apparatus of claim 5, further comprising:
   a lowpass filter configured to filter an analog output from the DAC.

9. The apparatus of claim 8, wherein the lowpass filter is a switch-capacitor filter.

10. The apparatus of claim 1, wherein the offset added to the input samples results in the output samples having an offset of approximately −1.

11. The apparatus of claim 1, wherein the input samples have 16 bits of resolution, and wherein the offset is −4929.

12. The apparatus of claim 1, wherein the summer and the sigma-delta modulator are part of an oversampling DAC.

13. The apparatus of claim 1, wherein the input samples are for an audio signal.

14. An integrated circuit comprising:
a summer configured to add an offset to input samples to generate intermediate samples;
a sigma-delta modulator configured to perform noise shaping on the intermediate samples and provide output samples, wherein each output sample comprises multiple bits; and
an offset removal unit configured to invert each of the multiple bits of each output sample to remove at least a portion of the offset.

15. The integrated circuit of claim 14, further comprising:
an interpolation filter configured to perform upsampling and interpolation filtering on data samples and provide the input samples.

16. A method comprising:
adding an offset to input samples to generate intermediate samples; and
performing noise shaping on the intermediate samples to generate output samples, wherein each output sample comprises multiple bits; and
inverting each of the multiple bits of each output sample to remove at least a portion of the offset.

17. The method of claim 16, further comprising:
performing upsampling and interpolation filtering on data samples to generate the input samples.

18. The method of claim 16, further comprising:
converting the output samples to analog using a plurality of digital-to-analog converter (DAC) elements; and
selecting different ones of the plurality of DAC elements based on the output samples.

19. An apparatus comprising:
means for adding an offset to input samples to generate intermediate samples; and
means for performing noise shaping on the intermediate samples to generate output samples, wherein each output sample comprises multiple bits; and
means for inverting each of the multiple bits of each output sample to remove at least a portion of the offset.

20. The apparatus of claim 19, further comprising:
means for performing upsampling and interpolation filtering on data samples to generate the input samples.

21. The apparatus of claim 19, further comprising:
means for converting the output samples to analog using a plurality of digital-to-analog converter (DAC) elements; and
means for selecting different ones of the plurality of DAC elements based on the output samples.

* * * * *